(12) United States Patent
Yao et al.

(10) Patent No.: US 8,553,921 B2
(45) Date of Patent: Oct. 8, 2013

(54) MINIATURE MICROPHONE, PROTECTION FRAME THEREOF AND METHOD FOR MANUFACTURING THE SAME

(75) Inventors: Rongguo Yao, WeiFang (CN);
Zhongyuan Liu, WeiFang (CN);
Xianbin Wang, WeiFang (CN);
Maoqiang Dang, WeiFang (CN);
Shaoyang Yao, WeiFang (CN)

(73) Assignee: GoerTek Inc., Weifang (CN)

( * ) Notice: Subject to any disclaimer, the term of this patent is extended or adjusted under 35 U.S.C. 154(b) by 321 days.

(21) Appl. No.: 12/918,360

(22) PCT Filed: Jul. 17, 2009

(86) PCT No.: PCT/CN2009/072817
§ 371 (c)(1),
(2), (4) Date: Aug. 19, 2010

(87) PCT Pub. No.: WO2010/006558
PCT Pub. Date: Jan. 21, 2010

(65) Prior Publication Data
US 2011/0026752 A1    Feb. 3, 2011

(30) Foreign Application Priority Data

Jul. 18, 2008  (CN) ............... 2008 2 0025960 U
Aug. 27, 2008  (CN) ............... 2008 1 0139099

(51) Int. Cl.
*H04R 25/00*    (2006.01)

(52) U.S. Cl.
USPC ........................................ 381/360; 381/174

(58) Field of Classification Search
USPC ............ 381/174–175, 355, 360, 369
See application file for complete search history.

(56) References Cited

U.S. PATENT DOCUMENTS

2006/0120544 A1* 6/2006 Akino ..................... 381/174
2008/0025532 A1* 1/2008 Yonehara et al. ......... 381/174
2009/0257613 A1* 10/2009 Khamashta et al. ...... 381/355

FOREIGN PATENT DOCUMENTS

CN        1909746 A      2/2007
CN        101152954       4/2008
(Continued)

OTHER PUBLICATIONS

International Search Report for PCT/CN2009/072817, issued Oct. 29, 2009.

(Continued)

*Primary Examiner* — Mohammad Islam
*Assistant Examiner* — Phylesha Dabney
(74) *Attorney, Agent, or Firm* — Troutman Sanders LLP (57) ABSTRACT

A miniature microphone is provided. In one embodiment, the miniature microphone comprises: a circuit board substrate at the upper part of the miniature microphone, wherein a plurality of contact pads are configured at prescribed positions on one side of the circuit board substrate and one or more electrical components are installed on the other side thereof; a protection frame with a cavity in the central portion thereoftherein, wherein one or more components are installed inside the cavity, the outer side of the protection frame forms the body portion, a first metal shielding layer is provided on the inner surface of the body portion, and an insulating mechanism is provided on the inner side of the first metal shielding layer, which enables the one or more components to be electrically insulated from the first metal shielding layer; and a bottom plate, wherein one or more sound holes are provided in the central portion thereoftherein for passing sound, and a second metal shielding layer is provided on the whole surface of the side of the bottom plate coming into contact with the protection frame.

8 Claims, 7 Drawing Sheets

(56) References Cited

FOREIGN PATENT DOCUMENTS

| | | |
|---|---|---|
| CN | 201123128 Y | 9/2008 |
| CN | 101360352 A | 2/2009 |
| CN | 201234345 Y | 5/2009 |

OTHER PUBLICATIONS

CN200810139099.8 Office Action.
CN200810139099.8 Response.
CN200810139099.8 Notice of Allowance.

* cited by examiner

MINIATURE MICROPHONE, PROTECTION FRAME THEREOF AND METHOD FOR MANUFACTURING THE SAME

BENEFIT CLAIMS

This application is a US National Stage of International Application No. PCT/CN2009/072817 filed 17 Jul. 2009, which claims the benefit of CN 200820025960.3, filed 18 Jul. 2008 and CN 200810139099.8, filed 27 Aug. 2008.

FIELD OF THE INVENTION

The present invention generally relates to a miniature microphone. More specifically, the present invention relates to a miniature microphone whose protection frame employs a circuit board material to achieve good shielding effect with low costs and a simple manufacturing process, and to the protection frame thereof and a method for manufacturing the same.

BACKGROUND

With the miniaturization of electronic products such as mobile phones, laptops, hearing aids and so on, it is required that the sizes of parts used in such devices should be getting smaller and smaller, thus, a miniature microphone having small size, high quality and shielding structure is getting well received by electronic device manufacturers day by day.

Figure 1:
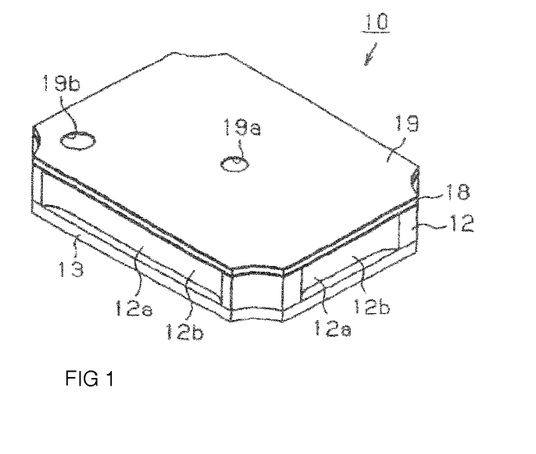
FIG. 1 is a perspective view showing the specific structure of a miniature microphone of the prior art.
Figure 2:
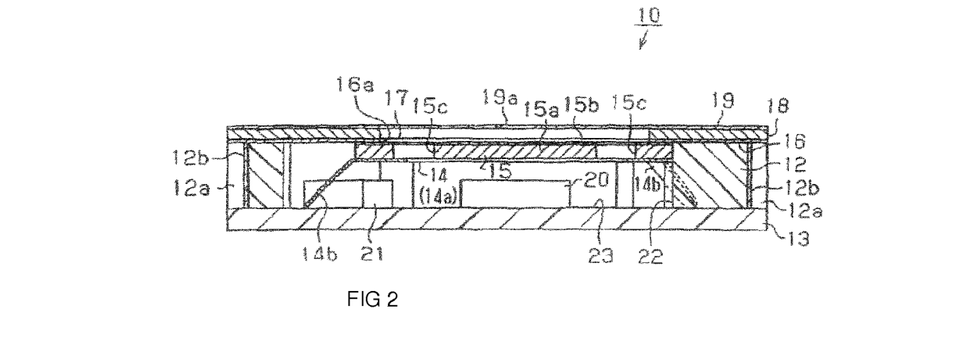
FIG. 2 is a cross-sectional view showing the specific structure of the miniature microphone of the prior art.

For example, a condenser microphone with a shielding function was disclosed in Chinese patent application publication No. CN1909746A (hereinafter, the "746 publication"). As shown in the perspective view of FIG. 1 and the cross-sectional view of FIG. 2 (also the FIG. 1 and FIG. 2 of the "746 publication"), the condenser microphone 10 mainly includes a frame-like body 12, a circuit substrate 13, a contact spring 14, a backplate 15, a spacer 16, a diaphragm 17, a diaphragm plate 18 and a cover 19. The frame-like body 12 comes to be the skeleton of the condenser microphone 10, it has a film-like electrically conducting layer 12b configured on the concave surfaces 12a formed on the outer lateral sides of the frame-like body 12, and has a upper conducting layer and a lower conducting layer formed respectively on the upper surface and the lower surface thereof. The frame-like body 12 is electrically connected to the cover 19 through the upper conducting layer, and is electrically connected to the ground side electrodes on the circuit substrate 13 through the lower conducting layer. Thus, the cover 19, the frame-like body 12 and the circuit substrate 13 form the casing of the condenser microphone, so that the circuits inside the frame-like body 12 are electromagnetically shielded.

Meanwhile, there is also disclosed a method of manufacturing the frame-like body 12 of the above-mentioned condenser microphone in the "746 publication". First, a plurality of holes 22, which are required for manufacturing the frames, are laterally and longitudinally formed at prescribed intervals on a circuit board substrate. Then, a plurality of long holes 30b, 30c, which are used to form a concave surface 12a and a conducting layer 12b, are formed at prescribed intervals around the holes 22. Thereafter, the long holes 30b, 30c are filled or coated with a conductive adhesive or conductive paste to form the conducting layer 12b. Finally, the long holes 30b, 30c are cut along the central lines thereof so as to obtain the frame-like body 12 having the surfaces on the outer lateral sides thereof configured with conducing layers.

However, there exist the following disadvantages in the above method of manufacturing the frames: (1) when the holes and the long holes required for the frames are processed, a CNC processing such as punching, drilling, or milling is usually employed, which results in a complicated machine process; (2) the long holes which are needed to be processed around the frames inevitably take up the space of the substrate, thereby reducing the material utilization.

If the conducting layer playing an electromagnetic shielding role is configured on the inner lateral sides of the frame, a problem will raise that the conducting layer is easy to come into contact with the electronic elements inside the frame and causes a short circuit, although the problems mentioned in the previous paragraph may be partially solved.

SUMMARY

The present invention has been invented for solving the above problems existing in the prior art, the goal thereof is to provide a miniature microphone, wherein, a circuit board material is applied in the protection frame of the miniature microphone, and a good shielding effect can be achieved with low costs and a simple manufacturing process.

Another goal of the invention is to provide a protection frame used in a miniature microphone, wherein, a metal shielding layer and an insulating mechanism are provided on the inner side of the body portion, so as not only to achieve a shielding function, but to prevent short circuits inside the miniature microphone.

Yet another goal of the invention is to provide a method of manufacturing a protection frame used in a miniature microphone, wherein, the method relates to a simple manufacturing process and can save raw materials.

To achieve the above goals, the present invention provides a miniature microphone comprising: a circuit board substrate at the upper part of the miniature microphone, wherein a plurality of contact pads are configured at prescribed positions on one side of the circuit board substrate and one or more electrical components are installed at prescribed positions on the other side thereof; a protection frame with a cavity in the central portion thereof and being in the form of a cylinder and with both ends opened, wherein one or more components can be installed inside the cavity, the outer side of the protection frame forms a body portion, a first metal shielding layer is provided on the inner surface of the body portion, and an insulating mechanism is provided on the inner side of the first metal shielding layer, which enables the one or more components to be electrically insulated from the first metal shielding layer; and a bottom plate, being in the form of an plain plate, wherein one or more sound holes are provided in the central portion thereof for passing sound, and a second metal shielding layer is provided on the whole surface of the side of the bottom plate coming into contact with the protection frame.

Preferably, the insulating mechanism is an insulating layer made of resin materials or solder resists and formed on the whole inner surface of the first metal shielding layer.

Preferably, the insulating mechanism comprises protruding portions integrally provided in the central portions of the four inner walls of the body portion, which protrude towards the cavity and extend along the height direction of the protection frame.

Preferably, the insulating mechanism comprises arc-like protruding portions provided in the four corners of the cavity, which protrude towards the cavity and extend along the height direction of the protection frame.

According to the miniature microphone of the present invention, since a metal shielding layer and an insulating layer are provided inside the protection frame, an electromagnetic shielding function can be reliably realized and an inner short circuit can be prevented, meanwhile, raw materials can be saved and the manufacturing process is simple.

To achieve the above goals, the present invention provides a protection frame used in a miniature microphone, characterized in that, the protection frame is provided with a cavity in the central portion thereof and being in the form of a cylinder with both ends opened, wherein one or more components are installed inside the cavity, the outer side of the protection frame forms the body portion, a first metal shielding layer is provided on the inner surface of the body portion, and an insulating mechanism is provided on the inner side of the first metal shielding layer, which enables the one or more components to be electrically insulated from the first metal shielding layer.

According to the protection frame of the present invention, since a metal shielding layer and an insulating layer are provided inside the protection frame, an electromagnetic shielding function can be reliably realized and an inner short circuit can be prevented, meanwhile, raw materials can be saved and the manufacturing process is simple.

To achieve the above goals, the present invention provides a method of manufacturing a protection frame used in a miniature microphone, comprising the steps of: (1) preparing a rectangular substrate made of an insulating material such as resin with a prescribed thickness and a prescribed area; (2) forming a plurality of rectangular holes laterally and longitudinally at prescribed intervals on the rectangular substrate; (3) forming a first metal shielding layer on the whole inner surface of each of the plurality of holes formed on the rectangular substrate; (4) filling an insulating material, used for forming an insulating layer, in the plurality of holes; (5) forming a plurality of extended portions of prescribed width in the form of a rectangular frame on the surfaces of both sides of the rectangular substrate, each extended portion covering a part of the end face of the insulating material and the whole end face of the first metal shielding layer; (6) forming a rectangular cavity of prescribed size in each of the centers of the insulating material filled holes, the length and the width of each cavity being, respectively, slightly smaller than the inner length and the inner width of the corresponding extended portion formed in the above mentioned step (5); and (7) cutting laterally and longitudinally the plurality of holes from the rectangular substrate to produce a collection of protection frames.

The present invention also provides an alternative method of manufacturing a protection frame used in a miniature microphone, comprising the steps of: (1) preparing a rectangular substrate made of an insulating material such as resin with a prescribed thickness and a prescribed area; (2) forming a plurality of adjacent holes laterally and longitudinally, by a drilling method, at prescribed positions on the rectangular substrate, wherein the contours of the holes are partially overlapped to form slits of certain lengths, but two adjacent holes at any corner of the rectangular processing regions are not overlapped so as to leave a short connection; (3) forming a first metal shielding layer on the whole inner surface of each of the plurality of holes; (4) filling an insulating material in the plurality of holes; (5) forming a plurality of extended portions of prescribed width on the surfaces of both sides of the substrate, each extended portion covering a part of the end face of the insulating material and the whole end face of the first metal shielding layer of a hole; (6) forming a rectangular cavity of prescribed size in each insulating material filled hole, the length and the width of each cavity are, respectively, slightly smaller than the inner length and the inner width of the corresponding extended portion formed in the above mentioned step (5); and (7) cutting laterally and longitudinally the plurality of holes from the rectangular substrate to produce a collection of protection frames.

According to the method of manufacturing the protection frame of present invention, the manufacturing process is simple; meanwhile, the material utilization efficiency is increased and the production costs are reduced.

BRIEF DESCRIPTION OF THE DRAWINGS

The foregoing and other features and advantages of the invention will be more apparent and more easily understood from the following description of exemplary embodiments of the present invention with reference to the appended drawings.

DETAILED DESCRIPTION

Thereinafter, specific embodiments of the present invention will be explained in details with reference to the appended drawings.

The First Embodiment

Figure 3:
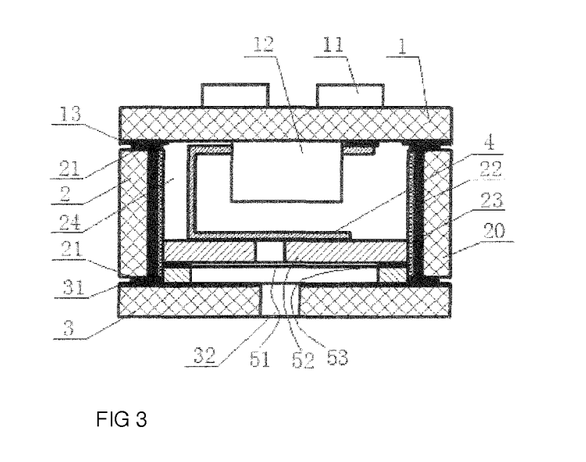
FIG. 3 is a cross-sectional view showing the overall structure of the miniature microphone according to the first embodiment of the present invention.
Figure 4:
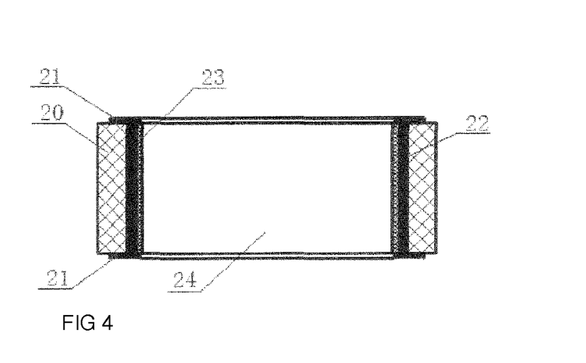
FIG. 4 is a cross-sectional view showing the overall structure of the protection frame of the miniature microphone according to the first embodiment of the present invention.

Firstly, the specific structure of the miniature microphone according to the first embodiment of the present invention will be explained with reference to FIG. 3 and FIG. 4. As shown in FIG. 3 and FIG. 4, the miniature microphone includes: the circuit board substrate 1, which is installed at the upper part of the miniature microphone, and is configured in advance with a plurality of pads 11 at prescribed positions on one side thereof and with electronic components such as signal processing units 12 at prescribed positions on the other side thereof; the open-ended cylindrical protection frame 2, the outer side portion of which forms body portion 20, wherein the body portion 20 may be made of a resin material, and the inner surface of the body portion 20 may be continuously covered with a first metal shielding layer 22. The inner surface of the metal shielding layer 22 may be further covered with an insulating layer 23 made of an insulating material such as resin. The space encircled by the additional insulating layer 23 is denoted as the cavity 24 of the protection frame 2. The upper and lower end faces of the body portion 20 are circumferentially configured with extended portions 21, which may be made of a metal material. The extended portions 21 cover a part of the body portion 20 and the whole insulating layer 23. The bottom plate 3, which may have the shape of a plain plate, may have a sound hole 32 configured in the central portion thereof for passing sound wave. The bottom plate 3 may also be provided with a second metal shielding layer 31 on the whole surface of the side that is coming into contact with the protection frame 2. The circuit board substrate 1 and the bottom plate 3 are installed on the upper side and lower side of the protection frame 2, respectively, so as to form the casing of the miniature microphone with an electromagnetic shielding capacity.

Also, capacitance components and a conductive part 4 may be installed inside the protection frame 2 for acoustic-electric signal conversion. The capacitance components may include the diaphragm 51, the electrode plate 52 and the spacer 53. The diaphragm 51 usually includes a metal ring and a vibration film, and the electrode plate 52 is usually configured with at least one hole, all of which are well known in the art, and a detailed description will thus be omitted.

Moreover, the conductive part 4, which is made of, for example, an elastic material, may be configured inside the protection frame 2 of the miniature microphone. One end of the conductive part 4 may be electrically connected to the conducting portion provided on one side of the circuit board substrate 1. The other end of the conductive part 4 may be electrically connected to the electrode plate 52, and thus serves as an input electrode of the capacitance components, so that external sound signals obtained through the capacitance components can be input into the signal processing unit 12 welded onto the circuit board substrate 1.

To ensure a better electromagnetic shielding effect, a third metal shielding layer 13 may be circumferentially provided on the surface of the circuit board substrate 1 which is coming into contact with the protection frame 2, and opposite to the extended portion 21 of the protection frame 2. The protection frame 2 may be electrically well-connected to the circuit board substrate 1 and the bottom plate 3 via the third metal shielding layer 13 and the second metal shielding layer 31 provided on the bottom plate 3, so as to achieve a reliable electromagnetic shielding effect.

The miniature microphone and the protection frame 2 according to the present embodiment may have a rectangular shape, but apparently, they may have other shapes as well, such as a circular, an elliptic, or a polygonal shape and so on. Meanwhile, the cavity of the protection frame 2 may also have other shapes instead of a rectangular shape, and the first shielding layer 22, the second shielding layer 31, the third shielding layer 13, the insulating layer 23, and the extended portion 21 may correspondingly be in the form of a circular ring and the like. Furthermore, the insulating layer 23 may be composed of solder resists coated on the whole surface of the first shielding layer 22.

Next, a method of manufacturing the miniature microphone according to the first embodiment of the present invention will be explained with reference to FIG. 5 through FIG. 7.

Firstly, a substrate made of an insulating material such as resin and with a prescribed thickness and a relatively large area is prepared. The substrate may have a rectangular shape.

Figure 5:
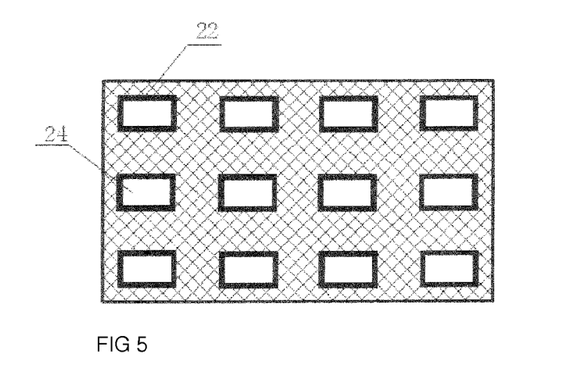
FIG. 5 through FIG. 7 are cross-sectional views showing the protection frames in a manufacturing process.

Secondly, as shown in FIG. 5, a plurality of rectangular holes 24 are laterally and longitudinally formed at prescribed intervals on the large area rectangular substrate. Here, a method such as punching, drilling, or milling (i.e. CNC processing) may be employed to process the holes 24.

Next, a first metal shielding layer 22 is formed, by a method such as chemical deposition of copper or electroplating, on the whole inner surface of each of the plurality of holes 24 formed on the circuit board substrate.

Figure 6:
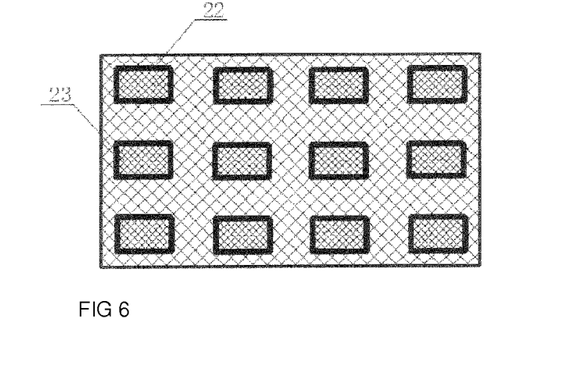

Then, as shown in FIG. 6, an insulating material such as resin is filled in the plurality of holes 24, so as to be used to form an insulating layer.

Figure 7:
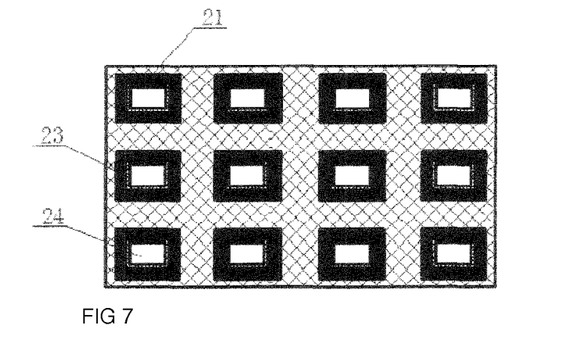

Subsequently, as shown in FIG. 7, the extended portions 21 of prescribed width are formed in the form of a rectangular frame by a method such as chemical deposition of copper or electroplating on both sides of the substrate, each extended portion covering a part of the end face of the insulating material and the whole end face of the first metal shielding layer 22 of a hole.

Thereafter, rectangular cavities 24 of prescribed size are processed in the insulating material-filled portions of the holes by a method such as punching, drilling, or milling (i.e. CNC processing), and the length and the width of each cavity 24 are slightly smaller than the inner length and the inner width of the corresponding extended portion 21 formed in the above mentioned steps, respectively, so that a part of the insulating layer 23 can be seen when taking an upward view or a downward view.

Here, a plurality of the protection frames 2 (i.e. holes 24) each with a metal shielding layer have been manufactured to be used in miniature microphones. Then, a collection of protection frames 2 can be produced by cutting the holes 24 from the substrate 1. Then, capacitance components and a conductive part 4 are assembled into the protection frame 2, and the circuit board substrate 1 and the bottom plate 3 are installed on the upper part and the lower part thereof, respectively, so as to form a miniature microphone.

Figure 8:
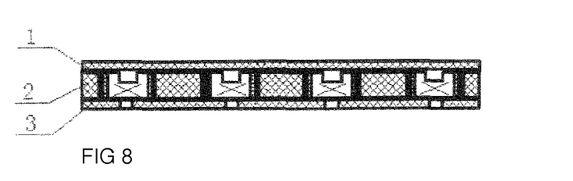
FIG. 8 is a cross-sectional view showing the miniature microphones in an assembling process according to the first embodiment.
Figure 9:
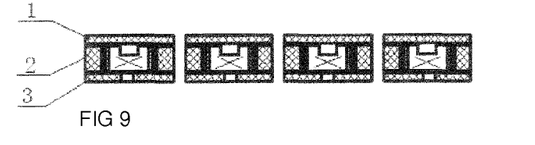
FIG. 9 is a cross-sectional view showing the miniature microphones after being cut off according to the first embodiment.

In another embodiment, in order to improve the assembly efficiency of the miniature microphone, in stead of first cutting the plurality of holes from the substrate, it is also possible, as shown in FIG. 8, that capacitance components, a conductive part 4 and so on are assembled into each of the protection frames 2 (holes 24) when the plurality of protection frames 2 are formed on the substrate, and then a plurality of circuit board substrates 1 and bottom plates 3, both equal in number to the protection frames 2, are respectively formed are installed at the upper part and the bottom part, respectively, of the substrate on which the protection frames 2 are formed, so as to form an array of miniature microphones connected to each other. Finally, as shown in FIG. 9, cutting can be performed upon the above miniature microphone array, so as to form a collection of miniature microphones.

Furthermore, the protection frame 2 used in the miniature microphone according to the present embodiments requires electromagnetic shielding function only and does not require a strict rectangular shape, therefore, when the protection frame 2 is in the form of a rectangle with rounded corners or in a round shape, it can be manufactured by the following manufacturing method.

Next, a method of manufacturing the protection frame 2 in such a shape will be explained with reference to FIG. 10 through FIG. 13. While a method of manufacturing the protection frame in the form of a rectangle with rounded corners is taken herein as an example for description, apparently, the following method can also be applied to other shapes such as a circular, an elliptic shape and so on.

Figure 10:
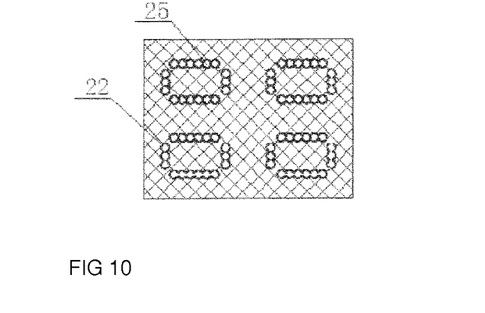
FIG. 10 through FIG. 13 are cross-sectional views showing the protection frames being manufactured according to an alternative method.

First of all, a large area rectangular substrate made of an insulating material such as resin is prepared. Next, as shown in FIG. 10, a plurality of adjacent small holes 25 may be laterally and longitudinally formed, by a drilling method, at prescribed positions with a prescribed interval therebetween on the rectangular substrate. The contours of the small holes 25 may be partially overlapped in either length direction or width direction so as to form slits of certain lengths, but two adjacent small holes 25 at a corner of a rectangle are not overlapped so as to leave a short connection that keeps the substrate portion surrounded by the slits not separate from the whole rectangular substrate.

Next, a first metal shielding layer 22 may be deposited, by a method such as chemical deposition of copper or electroplating, on the whole inner surface of the plurality of partially overlapped small holes 25 formed on the circuit board substrate.

Figure 11:
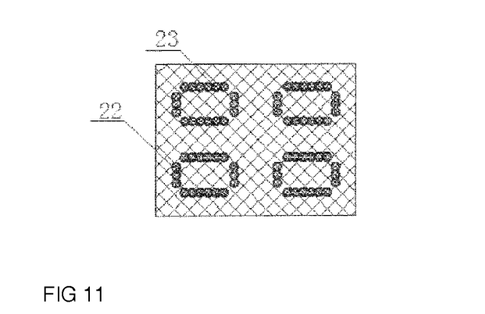

Then, as shown in FIG. 11, an insulating material such as resin is fully filled in the plurality of holes 25, so as to be used to form an insulating layer.

Figure 12:
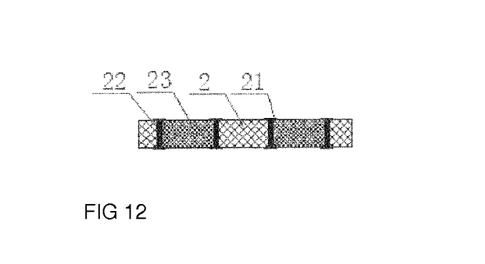

Subsequently, as shown in FIG. 12, the extended portions 21 of prescribed width may be formed in the form of a rectangular frame by a method such as chemical deposition of copper or electroplating on both sides of the substrate, each extended portion covering a part of the end face of the insulating material 23 and the whole end face of the first metal shielding layer 22 of a hole 25.

Figure 13:
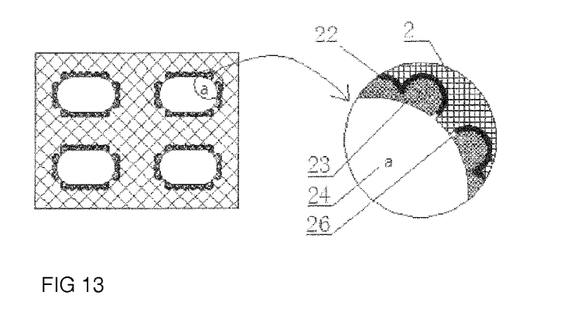

Thereafter, as shown in FIG. 13, rectangular cavities 24 of prescribed size may be processed roughly along the center lines of the insulating material filled portions by a method such as punching, drilling, or milling (i.e. CNC processing), and the length and the width of each cavity 24 may be slightly smaller than the inner length and the inner width of the corresponding extended portion 21 formed in the above mentioned steps, respectively, so that a part of the insulating layer 23 can be seen when taking an upward view or a downward view.

Then, similar to the above-mentioned method, a direct cutting can be performed upon the substrate so as to produce a collection of protection frames 2. Alternatively, it is also possible that capacitance components, a conductive part 4 and so on are first assembled, then a plurality of substrates on which circuit board substrates 1 and bottom plates 3, both equal in number to the protection frames 2, are respectively formed are installed at the upper part and the bottom part, respectively, of the substrate on which the protection frames 2 are formed, and finally cutting can be performed so as to form a collection of miniature microphones.

In the above processing method, it may be sufficient that only a plurality of same-sized small holes 25 are formed by using a simple drilling method on a circuit board substrate, and only a small amount of insulating material 23 is needed to fill in the small holes 25, which result in a simple manufacturing process and lower costs.

Also, the method can be further modified, as shown in the partially enlarged view in FIG. 13. For example, the exposed portions of the first metal shielding layer 22 on the inner wall of the cavity 24 may be etched back so as to prevent the elements installed inside the protection frame 2 from having a chance to come into contact with the first metal shielding layer 22.

The Second Embodiment

Next, the structure of the miniature microphone according to the second embodiment of the present invention will be explained with reference to the appended drawings.

Figure 14:
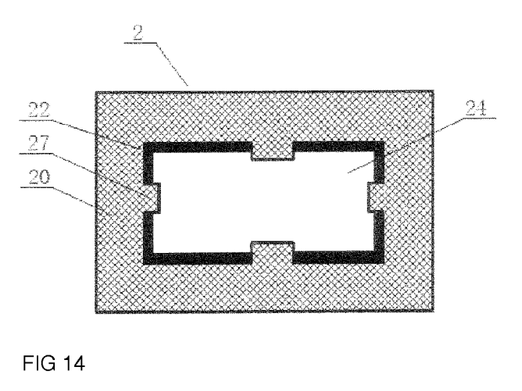
FIG. 14 is a cross-sectional view showing the specific structure of the protection frame of the miniature microphone according to the second embodiment of the present invention.

In comparison, the structure of the miniature microphone of the second embodiment is similar to that of the first embodiment, except that the structure of the protection frame 2 may be slightly different. Therefore, the specific structure of the protection frame 2 is emphasized herein, and detailed descriptions of other parts will be omitted.

As shown in FIG. 14, the protection frame 2 according to the present embodiment is also provided with an open-ended rectangular cylindrical structure, with the central portion thereof being a rectangular cavity 24 and the outer side portion thereof being a body portion 20 made of, for example, a resin material. The central portion of each of the four inner walls of the body portion 20 may be integrally provided with a protruding portion 27, which protrudes towards the cavity and extends along the height direction of the protection frame 2. Furthermore, a first metal shielding layer 22 is provided on the inner surface of the protection frame 2, with an exception of the protruding portions 27. The protruding portions 27 also poke up above the surface of the first metal shielding layer 22.

A variety of components installed inside the protection frame 2 are confined in the space surrounded by the four protruding portions 27, so that these components are prevented from coming into contact with the first metal shielding layer 22, thus avoiding a short circuit inside the miniature microphone.

Next, a method of manufacturing the protection frame 2 of the present embodiment will be briefly explained with reference to the appended drawings, wherein the description of the manufacturing steps similar to those of the miniature microphone of the first embodiment will be omitted.

Firstly, a rectangular substrate made of an insulating material such as resin with a prescribed thickness and a prescribed area is prepared.

Secondly, a plurality of cavities 24 with protruding portions 27 are laterally and longitudinally formed at prescribed intervals on the rectangular substrate. Here, a method such as punching, drilling, or milling (i.e. CNC processing) may be employed to process the cavities 24.

Next, a first metal shielding layer 22 is deposited, by a method such as chemical deposition of copper or electroplating, on the whole inner surface of the protection frame 2, wherein, the first metal shielding layer 22 is also deposited on the surfaces of the protruding portions 27.

Then, the first metal shielding layer on the surfaces of the protruding portions 27 is removed by milling or other methods.

Apart from the above manufacturing steps, the rest of the method is basically same as that in the first embodiment, and thus, detailed descriptions thereof will be omitted.

According to the above mentioned manufacturing method, it is not necessary to fill an insulating material such as resin in the cavity 24, nor is it necessary to process a hole in the filled insulating material subsequently. Thus, this method results in a simple manufacturing process, a saving in raw materials and a reduction in the amount of scraps produced as a result of drilling.

The Third Embodiment

Next, the structure of the miniature microphone according to the third embodiment of the present invention will be explained with reference to the appended drawings.

Figure 15:
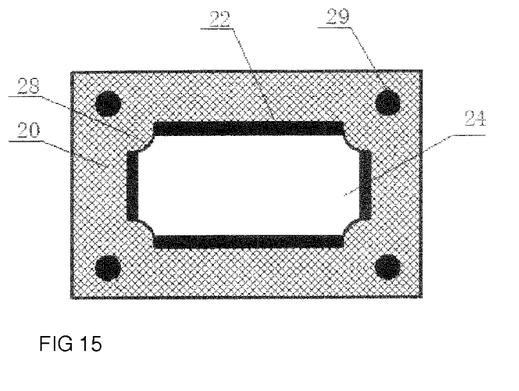
FIG. 15 is a cross-sectional view showing the specific structure of the protection frame of the miniature microphone according to the third embodiment of the present invention.

In comparison, the structure of the miniature microphone of the third embodiment is similar to that of the first embodiment, except that the structure of the protection frame 2 may be slightly different. Therefore, the specific structure of the protection frame 2 is emphasized herein, and detailed descriptions of other parts will be omitted.

As shown in FIG. 15, the protection frame 2 according to the present embodiment is also provided with an open-ended rectangular cylindrical structure, with the central portion thereof being a rectangular cavity 24 and the outer side portion thereof being a body portion 20 made of, for example, a resin material. Different from the structure of the protruding portions 27 configured in the central portions of the inner walls of the protection frame 2 according to the second embodiment, the protruding portions 28 in the protection frame 2 according to the present embodiment are integrally provided in the four corners of the cavity, which are in the form of an arc and protrude towards the cavity. Furthermore, a first metal shielding layer 22 is provided on the inner surface of the protection frame 2, with an exception of the protruding portions 28. The protruding portions 28 also poke up above the surface of the first metal shielding layer 22.

A variety of components installed inside the protection frame 2 are confined in the space surrounded by the four protruding portions 28, so that these components are prevented from coming into contact with the first metal shielding layer 22, thus avoiding a short circuit inside the miniature microphone.

Also, ground portions 29 may be provided in the body portion 20 between the corners of the protection frame 2 and the corresponding protruding portions 28, which are configured along the height direction of the protection frame 2 and run through the protection frame 2. By providing the ground portions 29, the anti-electromagnetic interference effect of the miniature microphone can be further improved.

Next, a method of manufacturing the protection frame 2 of the present embodiment will be briefly explained with reference to the appended drawings, wherein the description of the manufacturing steps similar to those of the miniature microphone of the first embodiment will be omitted.

Firstly, a rectangular substrate made of an insulating material such as resin with a prescribed thickness and a prescribed area is prepared.

Next, a plurality of cavities 24 with protruding portions 28 are laterally and longitudinally processed at prescribed intervals on the rectangular substrate. Here, a method such as punching, drilling, or milling (i.e. CNC processing) may be employed to process the cavities 24.

Next, a first metal shielding layer 22 is formed, by a method such as chemical deposition of copper or electroplating, on the whole inner surface of the protection frame 2, wherein, the first metal shielding layer 22 is also formed on the surfaces of the protruding portions 28.

Then, the first metal shielding layer on the surfaces of the protruding portions 28 is removed by milling or other methods.

Apart from above manufacturing steps, the procedure is basically same as that in the first embodiment, thus, detailed description thereof will be omitted.

According to the above mentioned manufacturing method, it is not necessary to fill an insulating material such as resin in the cavity 24, nor is it necessary to process a hole in the filled insulating material subsequently. Thus, the method results in a simple manufacturing process, a saving in raw materials and a reduction in the amount of scraps produced as a result of drilling.

The signal processing element disclosed in the present specification may adopt a common design in the art of miniature condenser microphones, such as a FET, an analog amplifier, a digital amplifier and so on. The circuit design inside the circuit board substrate, the contact pad design on the circuit board substrate and so on belong to the prior art, therefore, the detailed description thereof will be omitted herein. In general, the circuit board substrate, the circuit board frame and the bottom plate are adhesively bonded by conductive pastes.

Although the principle and the embodiments of the present invention have been described with respect to the miniature microphone and the protection frame used therein, it will be apparent to those skilled in the art that various modifications and variations may be accomplished based on the above embodiments in view of the teachings of the present invention, which fall within the scope of the present invention. It should be noted that the above detailed description is intended to explain rather than limit the present invention. The scope of the present invention is defined by the claims and their equivalents.

What is claimed is:

1. A miniature microphone, comprising:
   a circuit board substrate at the upper part of the miniature microphone, wherein a plurality of contact pads are configured at prescribed positions on one side of the circuit board substrate and electrical elements are installed at prescribed positions on the other side thereof;
   a protection frame with a cavity in the central portion thereof and being in the form of a cylinder with both ends opened, wherein one or more components can be installed inside the cavity, the outer side of the protection frame forms a body portion, a first metal shielding layer is provided on the inner surface of the body portion, and an insulating mechanism is provided on the inner side of the first metal shielding layer, which enables the one or more components to be electrically insulated from the first metal shielding layer; and
   a bottom plate, being in the form of an plain plate, wherein one or more sound holes are provided in the central portion thereof for passing sound, and a second metal shielding layer is provided on the whole surface of the side of the bottom plate coming into contact with the protection frame.

2. A miniature microphone according to claim 1, wherein the insulating mechanism is an insulating layer made of resin materials or solder resists and formed on the whole inner surface of the first metal shielding layer.

3. A miniature microphone according to claim 1, wherein the insulating mechanism comprises one or more protruding portions integrally provided in the central portions of the four inner walls of the body portion, said protruding portions protruding towards the cavity and extending along the height direction of the protection frame.

4. A miniature microphone according to claim 1, wherein the insulating mechanism comprises one or more arc-like protruding portions provided in the corners of the cavity, said protruding portions protruding towards the cavity and extending along the height direction of the protection frame.

5. A miniature microphone according to claim 4, further comprising
   one or more ground portions in the body portion between the corners of the protection frame and the corresponding protruding portions, said ground portions being configured along the height direction of the protection frame and run through the protection frame.

6. A miniature microphone according to any of claim 1 to claim 5, further comprising
   one or more extended portions made of metal materials, said extended portions being circumferentially provided on the upper and the lower end faces of the protection frame, and covering at least a part of the body portion of the protection frame.

7. A protection frame for a miniature microphone comprising a cavity in the central portion the protection frame and being in the form of a cylinder with both ends opened, wherein one or more components are installed inside the cavity; the outer side of the protection frame forms a body portion, a first metal shielding layer is provided on the inner surface of the body portion, and an insulating mechanism is provided on the inner side of the first metal shielding layer, which enables the one or more components to be electrically insulated from the first metal shielding layer; wherein the insulating mechanism is an insulating layer made of resin materials or solder resists and formed on the whole inner surface of the first metal shielding layer.

8. A protection frame for a miniature microphone comprising a cavity in the central portion the protection frame and being in the form of a cylinder with both ends opened, wherein one or more components are installed inside the cavity; the outer side of the protection frame forms a body portion, a first metal shielding layer is provided on the inner surface of the body portion, and an insulating mechanism is provided on the inner side of the first metal shielding layer, which enables the one or more components to be electrically insulated from the first metal shielding layer; wherein the insulating mechanism comprises one or more arc-like protruding portions provided in the corners of the cavity, said protruding portions protruding towards the cavity and extending along the height direction of the protection frame; said protection frame further comprising one or more ground portions in the body portion between the corners of the protection frame and the corresponding protruding portions, said ground portions being configured along the height direction of the protection frame and run through the protection frame.

* * * * *